United States Patent
Lee et al.

(10) Patent No.: US 9,123,560 B2
(45) Date of Patent: Sep. 1, 2015

(54) LIGHT EMITTING DEVICE HAVING IMPROVED COLOR RENDITION

(71) Applicant: Seoul Semiconductor Co., Ltd., Ansan-si (KR)

(72) Inventors: Chung Hoon Lee, Ansan-si (KR); Dae Sung Cho, Ansan-si (KR); Kyung Hee Ye, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/191,749

(22) Filed: Feb. 27, 2014

(65) Prior Publication Data

US 2014/0240975 A1 Aug. 28, 2014

(30) Foreign Application Priority Data

Feb. 27, 2013 (KR) .................. 10-2013-0021385

(51) Int. Cl.
*H01L 29/18* (2006.01)
*H01L 25/075* (2006.01)
*H01L 25/16* (2006.01)

(52) U.S. Cl.
CPC .......... *H01L 25/0753* (2013.01); *H01L 25/167* (2013.01); *H01L 2924/12041* (2013.01)

(58) Field of Classification Search
CPC .............. H01L 25/0753; H01L 25/167; H01L 2924/12041
USPC ............ 257/79, 81, 82, 88, E25.019, E25.02, 257/E25.028, E25.032
See application file for complete search history.

(56) References Cited

U.S. PATENT DOCUMENTS

| | | | |
|---|---|---|---|
| 2008/0101064 A1* | 5/2008 | Draganov et al. ............. | 362/231 |
| 2008/0121902 A1* | 5/2008 | Sackrison et al. ............. | 257/89 |
| 2013/0249411 A1* | 9/2013 | Takahashi et al. ............ | 315/158 |
| 2014/0197431 A1* | 7/2014 | Oka ................................ | 257/88 |

\* cited by examiner

*Primary Examiner* — Matthew E Warren
(74) *Attorney, Agent, or Firm* — H.C. Park & Associates, PLC

(57) ABSTRACT

A light emitting device includes a first light emitting diode chip comprising a red wavelength, a second light emitting diode chip comprising a different red wavelength from the wavelength of the first light emitting diode chip, and a plurality of third light emitting diode chips disposed around the first and second light emitting diode chips. The light emitting device emits light in a wavelength region similar to that of solar light, thereby improving color rendition.

17 Claims, 3 Drawing Sheets second conductive semiconductor layer first conductive semiconductor layer

US 9,123,560 B2

LIGHT EMITTING DEVICE HAVING IMPROVED COLOR RENDITION

CROSS-REFERENCE TO RELATED APPLICATION

This application claims priority from and the benefit of Korean Patent Application No. 10-2013-0021385, filed on Feb. 27, 2013, which is hereby incorporated by reference for all purposes as if fully set forth herein.

BACKGROUND

1. Field

Exemplary embodiments of the present invention relate to a light emitting device and, more particularly, to a light emitting device capable of improving color rendition.

2. Discussion of the Background

General light emitting devices generate light through recombination of electrons and holes in an area between an n-type semiconductor layer and a p-type semiconductor layer.

The light emitting devices are broadly applied to displays and lighting fixtures in various ways.

Recently, high brightness light emitting devices are used in the art. A typical light emitting device emits white light through a combination of yellow phosphors and a blue light emitting chip.

However, light emitted from the typical light emitting device is within a specific wavelength range, thereby causing deterioration in color rendition.

To improve color rendition, a red light emitting diode may be additionally used. However, color rendition varies according to arrangement of the red light emitting diode, thereby making it difficult to obtain a light emitting device having high color rendition, which can satisfy consumer requirements.

SUMMARY OF THE INVENTION

Exemplary embodiments of the present invention provide a light emitting device capable of emitting light similar to solar light through improvement in color rendition.

In accordance with one aspect of the invention, a light emitting device includes: a first light emitting diode chip having a red light wavelength; a second light emitting diode chip having a different red light wavelength from the wavelength of the first light emitting diode chip; and a plurality of third light emitting diode chips disposed around the first and second light emitting diode chips.

In accordance with another aspect of the invention, a light emitting device includes: a substrate, a first light emitting diode chip disposed on the substrate and configured to emit light in a first red light wavelength range, a second light emitting diode chip disposed on the substrate and configured to emit light in a second red light wavelength range different from the first red light wavelength range, and third light emitting diode chips disposed on the substrate. Each of the third light emitting diode chips is configured to emit blue light in a first blue light wavelength range and in a second blue light wavelength range different from the first blue light wavelength range.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
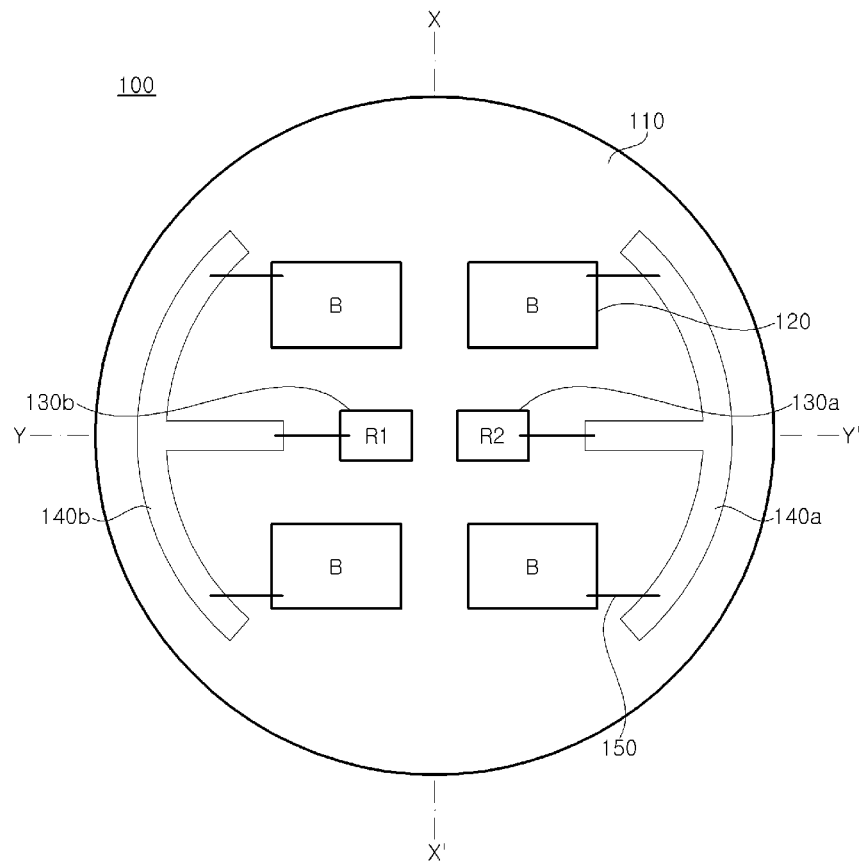
FIG. 1 is a plan view of a light emitting device according to an exemplary embodiment of the present invention.

Embodiments of the present invention will be described in more detail with reference to the accompanying drawings. It should be understood that the following embodiments are given by way of illustration only to provide thorough understanding of the invention to those skilled in the art. Therefore, the present invention is not limited to the following embodiments and may be embodied in different ways. Further, the widths, lengths, and thicknesses of certain elements, layers or features may be exaggerated for clarity, and like components will be denoted by like reference numerals throughout the specification. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
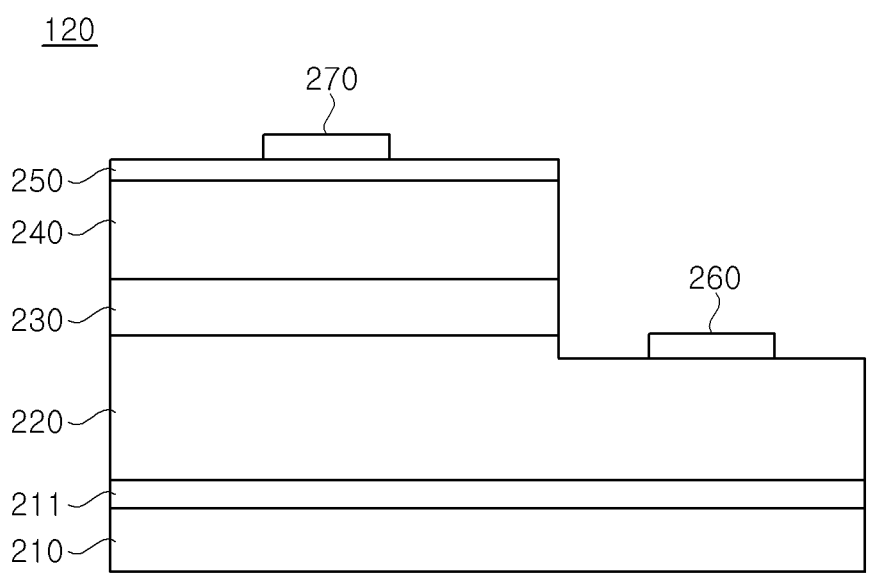
FIG. 2 is a sectional view of a third light emitting diode chip of the light emitting device of FIG. 1.

FIG. 1 is a plan view of a light emitting device according to an exemplary embodiment of the present invention, and FIG. 2 is a sectional view of a third light emitting diode chip of the light emitting device of FIG. 1.

As shown in FIG. 1 and FIG. 2, a light emitting device 100 according to one exemplary embodiment of the invention includes a substrate 110, first and second conductive patterns 140a, 140b on the substrate 110, first and second light emitting diode chips 130a, 130b on the substrate 110, and a plurality of third light emitting diode chips 120 on the substrate 110. Although shown as quadrangular, the substrate 110 may have various shapes, such as square, circular, oval, polygonal, etc. Similarly, the light emitting diode chips may also have various shapes besides the quadrangular shape of FIG. 1.

The first light emitting diode chip 130a has a red light wavelength. Specifically, the first light emitting diode chip 130a may emit light in a wavelength range of, for example, 600 nm to 630 nm.

The second light emitting diode chip 130b has a red light wavelength. Specifically, the second light emitting diode chip 130b may emit light in a wavelength range of, for example, 630 nm to 660 nm.

The first and second light emitting diode chips 130a, 130b have different peak wavelength ranges. Here, the first light emitting diode chip 130a emits red light having a lower wavelength range than that of red light emitted from the second light emitting diode chip 130b.

The first and second light emitting diode chips 130a, 130b are arranged side by side and separated a predetermined distance from each other with reference to a central portion of the substrate 110. That is, the first and second light emitting diode chips 130a, 130b may be symmetrically arranged about axis X-X'. Furthermore, in some exemplary embodiments, as shown in FIG. 1, each of the first and second light emitting diode chips 130a, 130b may also be symmetrically arranged about axis Y-Y'.

The third light emitting diode chips 120 are disposed near corner areas on the substrate 110 and are separated a predetermined distance from each other. That is, the light emitting device includes plural third light emitting diode chips 120 corresponding to corners of the substrate 110. The third light emitting diode chips 120 may be arranged symmetrically on the substrate 110. That is, the third light emitting diode chips 120 may be symmetrically arranged about axis X-X' and about axis Y-Y'. In some exemplary embodiments, the third light emitting diode chips 120 may also be symmetrically arranged about a diagonal axis (not shown) on the substrate 110.

Each of the third light emitting diode chips 120 provides at least two blue light wavelength ranges. That is, the third light emitting diode chips 120 have a wider full width at half maximum (FWHM) than general blue light emitting diode chips. Herein, the full width at half maximum (FWHM) may be defined as a width corresponding about half a peak wavelength of the third light emitting diode chips 120.

According to exemplary embodiments of the invention, the third light emitting diode chips 120 may realize blue light having a wide FWHM through a novel structure wherein an active layer of a quantum well structure includes well layers.

The first and second conductive patterns 140a, 140b are disposed parallel to each other to be symmetrical to each other on the substrate 110. That is, the first and second conductive patterns 140a, 140b may be symmetrically arranged about axis X-X'. Furthermore, as shown in FIG. 1, in some exemplary embodiments, each of the first and second conductive patterns 140a, 140b may also be symmetrically arranged about axis Y-Y'.

The first light emitting diode chip 130a and some of the third light emitting diode chips 120 are connected to the first conductive pattern 140a by a bonding wire 150, and the second light emitting diode chip 130b and the other third light emitting diode chips 120 are connected to the second conductive pattern 140b by a bonding wire 150.

For better understanding, the third light emitting diode chips 120 will be described in more detail. Each of the third light emitting diode chips 120 may include a growth substrate 210, a buffer layer 211, a first conductivity-type semiconductor layer 220, an active layer 230, a second conductivity-type semiconductor layer 240, a transparent electrode layer 250, and first and second electrodes 260, 270.

The growth substrate 210 may be a substrate for growing a gallium nitride compound semiconductor layer, such as a sapphire substrate, a spinel substrate, a gallium nitride substrate, a silicon carbide substrate, or a silicon substrate, without being limited thereto.

The active layer 230 and the first and second conductivity-type semiconductor layers 220, 240 may be formed of a gallium nitride-based compound semiconductor material, that is, (Al, In, Ga)N. For the active layer 230, compositional elements and ratio may be determined to emit light in a desired wavelength range, for example, ultraviolet light or visible light. The active layer 230 and the first and second conductivity-type semiconductor layers 220, 240 may be formed by MOCVD or MBE.

The active layer 230 has a multi-quantum well structure and emits light due to an energy band gap. In this embodiment, the active layer 230 has a stack structure in which well layers and barrier layers are alternately stacked. Here, well layers may have at least two different thicknesses.

The first conductivity-type semiconductor layer 220 may be an n-type nitride semiconductor layer, and the second conductivity-type semiconductor layer 240 may be a p-type nitride semiconductor layer. Each of the first and second conductivity-type semiconductor layers 220, 240 may be formed as a single layer or multiple layers.

The transparent electrode layer 250 may be formed of a transparent oxide such as ITO, or Ni/Au, and is in ohmic contact with the second conductivity-type semiconductor layer 240.

The first electrode 260 is formed on the first conductivity-type semiconductor layer 220, and the second electrode 270 is formed on the second conductivity-type semiconductor layer 240.

The first electrode 260 may be formed on an exposed region of the first conductivity-type semiconductor layer 220, which may be formed by partially etching the second conductivity-type semiconductor layer 240 and the active layer 230, as well as an upper part of the first conductivity-type semiconductor layer 220.

According to an exemplary embodiment of the invention, the light emitting device 100 may improve color rendition of a final output wavelength range through the first and second light emitting diode chips 130a, 130b emitting red light in different wavelength ranges and the third light emitting diode chips 120 emitting blue light in at least two wavelength ranges. As a result, the light emitting device 100 can emit light similar to solar light.

Figure 3:
FIG. 3 is a sectional view of an active layer of a quantum well structure according to an exemplary embodiment of the present invention.
Figure 4:
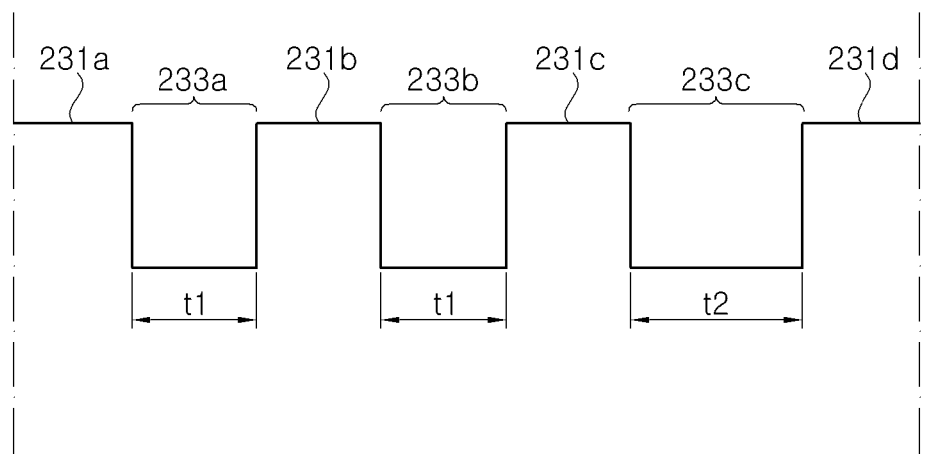
FIG. 4 shows an energy band gap of a third light emitting diode according to an exemplary embodiment of the present invention.

FIG. 3 is a sectional view of an active layer of a quantum well structure, and FIG. 4 shows an energy band gap of a third light emitting diode according to an exemplary embodiment of the present invention.

As shown in FIG. 2, FIG. 3, and FIG. 4, the active layer 230 according to an exemplary embodiment of the present invention has a multi-quantum well structure. That is, the active layer 230 has a structure wherein first to fourth barrier layers 231a, 231b, 231c, and 231d and first to third well layers 233a, 233b, and 233c are alternately stacked.

In this embodiment, the active layer 230 includes four barrier layers and three well layers. However, it should be noted that the active layer 230 may include N barrier layers and N−1 well layers.

The first to third well layers 233a to 233c may be formed of a semiconductor material represented by, for example, a compositional formula $In_xGa_{1-x}N$ (0≤x≤1).

The first to fourth barrier layers 231a to 231d may be formed of a semiconductor material represented by, for example, a compositional formula $In_yGa_{1-y}N$ (0≤y≤1, 0≤x+y≤1).

The first well layer 233a and the first barrier layer 231a are disposed near the first conductivity-type semiconductor layer 220, and the third well layer 233c and the fourth barrier layer 231d are disposed near the second conductivity-type semiconductor layer 240.

The first to third barrier layers 231a to 231c may be doped with n-type impurities, and the fourth barrier layer 231d disposed near the second conductivity-type semiconductor layer 240 may not contain impurities.

The first to third well layers 233a to 233c may have at least two different thicknesses. In one embodiment of the invention, the first and second well layers 233a, 233b have the same first thickness (t1), and the third well layer 233c may have a second thickness (t2) greater than the thickness (t1) of the first and second well layers 233a, 233b.

The first and second well layers 233a, 233b may have the same thickness for growth stability.

The third well layer 233c is disposed near the second conductivity-type semiconductor layer 240. Here, the structure wherein the second thickness (t2) of the third well layer 233c disposed near the second conductivity-type semiconductor layer 240 is greater than the first thickness (t1) of the first and second well layers 233a, 233b is determined in consideration of active recombination in a region of the active layer 230 adjacent the second conductivity-type semiconductor layer 240.

The third well layer 233c emits light having a wavelength of about 430-460 nm, and the first and second well layers 233a, 233b emit light having a wavelength of 400-430 nm.

Accordingly, in the third light emitting diode chip 120 according to exemplary embodiments of the present invention, the thickness of the third well layer 233c disposed near the second conductivity-type semiconductor layer 240 is greater than the thickness of the first and second well layers 233a, 233b to emit blue light in a long wavelength range, thereby realizing a wide full width at half maximum. As noted above, in other exemplary embodiments, the active layer 230 may include N barrier layers and N−1 well layers. For example, the active layer may include 5 barrier layers and 4 well layers. In such a case, the top two well layers may both have the thickness (t2) or they may have different thicknesses from each other, provided that a thickness of at least one of the top two well layers exceeds the thickness (t1).

In other words, exemplary embodiments of the present invention provide a light emitting device that may have excellent color rendition by providing at least two blue color wavelength ranges.

According to exemplary embodiments of the invention, the light emitting device includes first and second light emitting diode chips emitting red light in different wavelength ranges and third light emitting diode chips emitting blue light in at least two wavelength ranges, thereby improving color rendition of a final output wavelength range. As a result, the light emitting device according to exemplary embodiments of the present invention can emit light similar to solar light.

In addition, according to exemplary embodiments of the present invention, the third light emitting diode chips include a well layer disposed near the second conductivity-type semiconductor layer having a greater thickness than other well layers to emit blue light in a long wavelength range, thereby realizing a wide full width at half maximum. That is, exemplary embodiments of the present invention can realize a light emitting device that may have excellent color rendition by providing at least two blue color wavelength ranges.

Although some exemplary embodiments have been described above, it should be understood that the present invention is not limited to the embodiments and features described above, and that various modifications, variations, and alterations can be made without departing from the spirit and scope of the invention. Therefore, the scope of the invention should be limited only by the accompanying claims and equivalents thereof.

What is claimed is:

1. A light emitting device, comprising:
  a first light emitting diode chip configured to emit light in a red light wavelength;
  a second light emitting diode chip configured to emit light in a different red light wavelength from the wavelength of the first light emitting diode chip; and
  a plurality of third light emitting diode chips disposed around the first and second light emitting diode chips,
  wherein each of the plurality of third light emitting diode chips comprises an active layer of a quantum well structure having alternately stacked well layers and barrier layers, the well layers having at least two different thicknesses.

2. The light emitting device of claim 1, wherein each of the plurality of third light emitting diode chips further comprises:
  a first conductivity-type semiconductor layer disposed on one side of the active layer; and
  a second conductivity-type semiconductor layer disposed on the other side of the active layer,
  wherein the well layers comprise:
  at least one first well layer adjacent the first conductivity-type semiconductor layer; and
  at least one second well layer adjacent the second conductivity-type semiconductor layer,
  wherein a thickness of the at least one second well layer exceeds a thickness of the at least one first well layer.

3. The light emitting device of claim 2, wherein plural second well layers have different thicknesses.

4. The light emitting device of claim 2, wherein plural first well layers have a uniform thickness.

5. The light emitting device of claim 2, wherein the at least one first well layer is configured to emit light comprising a wavelength of 400 nm to 430 nm.

6. The light emitting device of claim 2, wherein the at least one second well layer is configured to emit light comprising a wavelength of 430 nm to 460 nm.

7. The light emitting device of claim 1, wherein the well layers comprise a semiconductor material represented by a compositional formula $In_xGa_{1-x}N$ ($0 \leq x \leq 1$) and the barrier layers comprise a semiconductor material represented by a compositional formula $In_yGa_{1-y}N$ ($0 \leq y \leq 1$, $0 \leq x+y \leq 1$).

8. The light emitting device of claim 1, wherein the first light emitting diode chip is configured to emit light comprising a wavelength in a range of 600 nm to 630 nm.

9. The light emitting device of claim 7, wherein the second light emitting diode chip is configured to emit light comprising a wavelength in a range of 630 nm to 660 nm.

10. The light emitting device of claim 1, further comprising:
  a substrate on which the first, second, and third light emitting diode chips are disposed, the substrate comprising first and second conductive patterns symmetrical to each other thereon.

11. The light emitting device of claim 10, wherein the first and second light emitting diode chips are disposed at opposite sides of a central portion of the substrate and are spaced apart from each other, the first light emitting diode chip is electrically connected to the first conductive pattern, and the second light emitting diode chip is electrically connected to the second conductive pattern.

12. The light emitting device of claim 10, wherein the third light emitting diode chips are respectively disposed at corner areas of the substrate and connected to the first and second conductive patterns to be symmetrical in at least one of vertical, horizontal, and diagonal directions while being spaced apart from each other.

13. A light emitting device, comprising:
  a substrate;

a first light emitting diode chip disposed on the substrate and configured to emit light in a first red light wavelength range;

a second light emitting diode chip disposed on the substrate and configured to emit light in a second red light wavelength range different from the first red light wavelength range; and third light emitting diode chips disposed on the substrate, each of the third light emitting diode chips configured to emit blue light in a first blue light wavelength range and in a second blue light wavelength range different from the first blue light wavelength range, wherein each of the third light emitting diode chips comprises an active layer of a quantum well structure having alternately stacked well layers and barrier layers, the well layers having at least two different thicknesses.

14. The light emitting device of claim 13, wherein among the first light emitting diode chip, the second light emitting diode chip, and the third light emitting diode chips, the first and second light emitting diode chips are disposed closer to a center of the substrate than are the third light emitting diode chips.

15. The light emitting device of claim 14, wherein the first light emitting diode chip is disposed symmetrically with the second light emitting diode chip about an axis passing through the center of the substrate.

16. The light emitting device of claim 15, wherein at least two third light emitting diode chips are disposed symmetrically with at least two other third light emitting diode chips about the axis passing through the center of the substrate.

17. The light emitting device of claim 16, wherein the first red light wavelength range is 600 nm to 630 nm, and the second red light wavelength range is 630 nm to 660 nm.

* * * * *